(12) United States Patent
Huang

(10) Patent No.: US 11,735,639 B2
(45) Date of Patent: Aug. 22, 2023

(54) ARRAY SUBSTRATE AND DISPLAY PANEL

(71) Applicant: HKC CORPORATION LIMITED, Shenzhen (CN)

(72) Inventor: Bei Zhou Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 864 days.

(21) Appl. No.: 16/319,476

(22) PCT Filed: Oct. 31, 2018

(86) PCT No.: PCT/CN2018/112864
§ 371 (c)(1),
(2) Date: Jan. 22, 2019

(87) PCT Pub. No.: WO2020/052019
PCT Pub. Date: Mar. 19, 2020

(65) Prior Publication Data
US 2021/0336023 A1    Oct. 28, 2021

(30) Foreign Application Priority Data

Sep. 13, 2018  (CN) .......................... 201821501613.3

(51) Int. Cl.
*H01L 27/12* (2006.01)
*H01L 29/423* (2006.01)
*H01L 29/417* (2006.01)

(52) U.S. Cl.
CPC .... *H01L 29/42384* (2013.01); *H01L 27/1259* (2013.01); *H01L 29/41733* (2013.01); *H01L 2029/42388* (2013.01)

(58) Field of Classification Search
CPC combination set(s) only.
See application file for complete search history.

(56) References Cited

U.S. PATENT DOCUMENTS

| 2006/0091793 A1* | 5/2006 | Baude | H01L 27/1218 |
|---|---|---|---|
| | | | 313/506 |
| 2014/0204305 A1* | 7/2014 | Tseng | H01L 29/7869 |
| | | | 349/46 |
| 2017/0148817 A1* | 5/2017 | Shi | H01L 21/02565 |
| 2019/0172954 A1* | 6/2019 | Zhou | H01L 21/47635 |
| 2019/0372037 A1* | 12/2019 | Kim | H01L 29/78696 |
| 2020/0166792 A1* | 5/2020 | Huang | H01L 31/1884 |

FOREIGN PATENT DOCUMENTS

| CN | 101013240 A | 8/2007 |
|---|---|---|
| CN | 103943631 A | 7/2014 |
| CN | 105589276 A | 5/2016 |
| CN | 105702683 A | 6/2016 |

OTHER PUBLICATIONS

Zeyu Ma, the ISA written comments, dated June, 2019, CN.

* cited by examiner

*Primary Examiner* — Moin M Rahman

(57) ABSTRACT

This application discloses an array substrate and a display panel. The array substrate includes a first metal layer and a second metal layer, and an area of a region overlapping the second metal layer on the first metal layer is less than that of a region not overlapping the second metal layer on the first metal layer.

13 Claims, 3 Drawing Sheets

ARRAY SUBSTRATE AND DISPLAY PANEL

This application claims priority to Chinese Patent Application No. CN201821501613.3, filed with the Chinese Patent Office on Sep. 13, 2018, and entitled "ARRAY SUBSTRATE AND DISPLAY PANEL", which is incorporated herein by reference in its entirety.

TECHNICAL FIELD

This solution relates to the field of display technologies, and in particular, to an array substrate and a display panel.

BACKGROUND

The description herein provides only background information related to this application, but does not necessarily constitute the existing technology.

Most of rapid advancement of a multimedia society benefits by great advancement of semiconductor elements or display apparatuses. For displays, thin film transistor liquid crystal displays (TFT-LCD) that have superior features such as high picture quality, good space utilization efficiency, low power consumption, and no radiation already gradually become a mainstream of the market. A thin film transistor display mainly includes an array substrate, a color filter, and a liquid crystal layer. The array substrate includes a plurality of thin film transistors (TFT) arranged in arrays and pixel electrodes configured corresponding to the TFTs, and the TFTs are used as switch elements of liquid crystal display. The array substrate mainly uses a bottom gate TFT (Bottom Gate TFT). Parasitic capacitance of the TFTs is relatively large, which is not good for high resolution and an aperture ratio of a display panel, and affects display quality of the display panel.

SUMMARY

An objective of this application is to provide an array substrate and a display panel, to resolve a problem of relatively large parasitic capacitance.

To achieve the foregoing objective, this application provides an array substrate. The array substrate comprises:
a substrate;
a first metal layer, arranged on a surface of the substrate;
an insulating layer, arranged on a surface of the first metal layer;
a semiconductor layer, arranged on a surface of the insulating layer; and
a second metal layer, arranged on a surface of the semiconductor layer, wherein
an overlapping region exists between the first metal layer and the second metal layer; and
an area of a region overlapping the second metal layer on the first metal layer is less than that of a region not overlapping the second metal layer on the first metal layer.

Optionally, the first metal layer comprises a gate, arranged on the substrate, the second metal layer comprises a source and a drain, the source is arranged on one side of the semiconductor layer, and the drain is arranged on the other side of the semiconductor layer;
an overlapping region exists between the gate and the source, and an overlapping region exists between the gate and the drain; and
an area of a region overlapping the gate on the source is less than that of a region not overlapping the gate on the source, and an area of a region overlapping the gate on the drain is less than that of a region not overlapping the gate on the drain.

Optionally, a length of the region overlapping the gate on the source is L1, a length of the region not overlapping the gate on the source is L2, a length of the region overlapping the gate on the drain is L3, a length of the region not overlapping the gate on the drain is L4, L1 is less than L2, and L3 is less than L4.

Optionally, L1 and L3 range from 0.5 µm to 3 µm.

Optionally, L1 is one quarter to two thirds L2, and L3 is one quarter to two thirds L4.

Optionally, a width of a region overlapping the source on the gate is W1, a width of the source is W2, a width of a region overlapping the drain on the gate is W3, a width of the drain is W4, W1 is less than W2, and W3 is less than W4.

Optionally, a thickness of a region overlapping the source on the gate is D1, a thickness of a region overlapping the drain on the gate is D2, a thickness of a region not overlapping the source on the gate and the drain is D3, and D1 and D2 is less than D3.

Optionally, a thickness of the region overlapping the gate on the source is H1, a thickness of the region not overlapping the gate on the source is H2, and a thickness of the region overlapping the gate on the drain is H3, a thickness of the region not overlapping the gate on the drain is H4, H2 is greater than H1, and H4 is greater than H3.

Optionally, D1 is one third to two thirds D3, and D2 is one third to two thirds D3.

Optionally, H1 is one third to two thirds H2, and H3 is one third to two thirds H4.

Another objective of this application is to provide a display panel. The display panel comprises an array substrate. The array substrate comprises:
a substrate;
a first metal layer, arranged on a surface of the substrate;
an insulating layer, arranged on a surface of the first metal layer;
a semiconductor layer, arranged on a surface of the insulating layer; and
a second metal layer, arranged on a surface of the semiconductor layer, wherein
an overlapping region exists between the first metal layer and the second metal layer; and
an area of a region overlapping the second metal layer on the first metal layer is less than that of a region not overlapping the second metal layer on the first metal layer.

Still another objective of this application is to provide a method for manufacturing an array substrate, comprising steps of forming a first metal layer, an insulating layer, a semiconductor layer, a second metal layer, a passivation layer, and an ITO layer on a substrate, wherein
in the steps of forming the first metal layer and forming the second metal layer, an area of a region overlapping the second metal layer on the first metal layer is caused to be less than that of a region not overlapping the second metal layer on the first metal layer.

The applicant finds through research that the array substrate mainly uses a bottom gate TFT (Bottom Gate TFT). For the array substrate of such a structure, the area of the region overlapping the second metal layer on the first metal layer is relatively large, and parasitic capacitance of TFTs is relatively large, which is not good for high resolution and an aperture ratio of the display panel, and affects display quality of the display panel. In this application, the first metal layer is below the second metal layer. The area of the region overlapping the second metal layer on the first metal layer is less than that of the region not overlapping the second metal layer on the first metal layer. The area of the overlapping region decreases, and parasitic capacitance generated between the first metal layer and the second metal layer decreases, which is good for the high resolution and the aperture ratio of the display panel, and improves the display quality of the display panel.

BRIEF DESCRIPTION OF DRAWINGS

The included accompanying drawings are intended to provide further understanding of embodiments of this application and constitute a part of the specification. The exemplary implementations of this application and description are intended to explain the principle of this application. Apparently, the accompanying drawings in the following description show merely some embodiments of this application, and persons of ordinary skill in the art may still derive other drawings from these accompanying drawings without creative efforts. In the accompanying drawings.

DETAILED DESCRIPTION

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical", "horizontal", "top". "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly include one or more of said features. In the description of this application, unless otherwise stated, "a plurality of" means two or more than two. In addition, the terms "include". "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a". "an" and "the" are intended to include the plural forms as well, unless the context clearly indicates otherwise. It should be further understood that the terms "include" and/or "comprise" when used in this specification, specify the presence of stated features, integers, steps, operations, elements, and/or components, but do not preclude the presence or addition of one or more other features, integers, steps, operations, elements, components, and/or combinations thereof.

Figure 1:
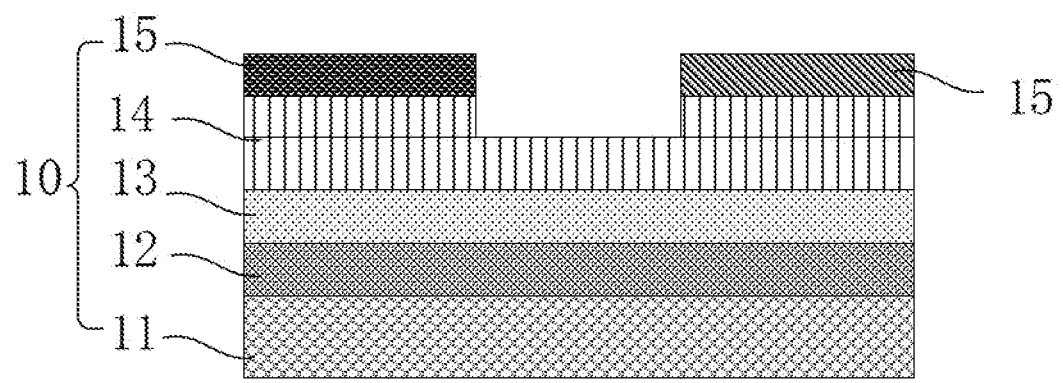
FIG. 1 is a schematic sectional view of an array substrate.
Figure 2:
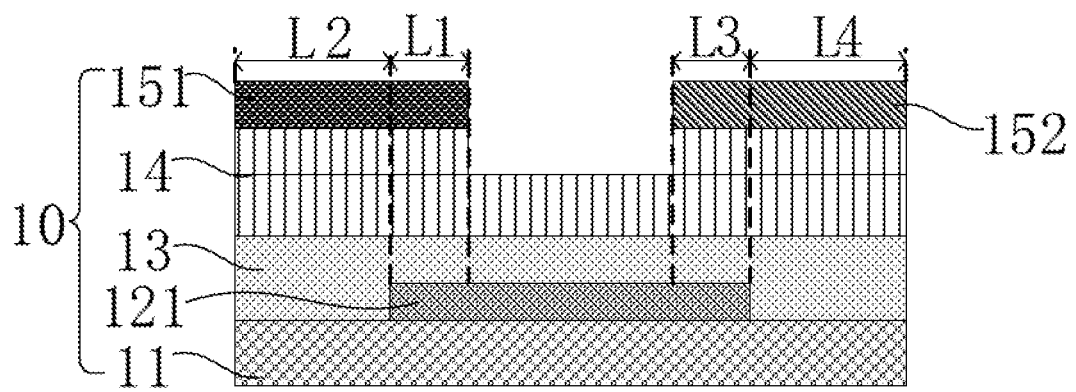
FIG. 2 is a schematic sectional view of another array substrate according to this application.
Figure 3:
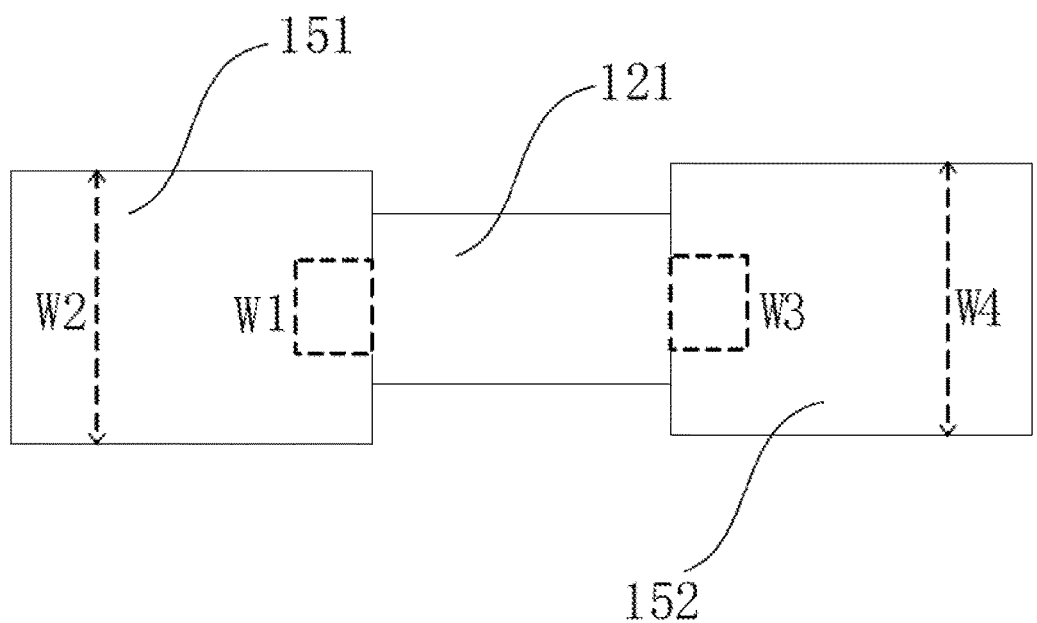
FIG. 3 is a schematic top view of an array substrate according to this application.
Figure 4:
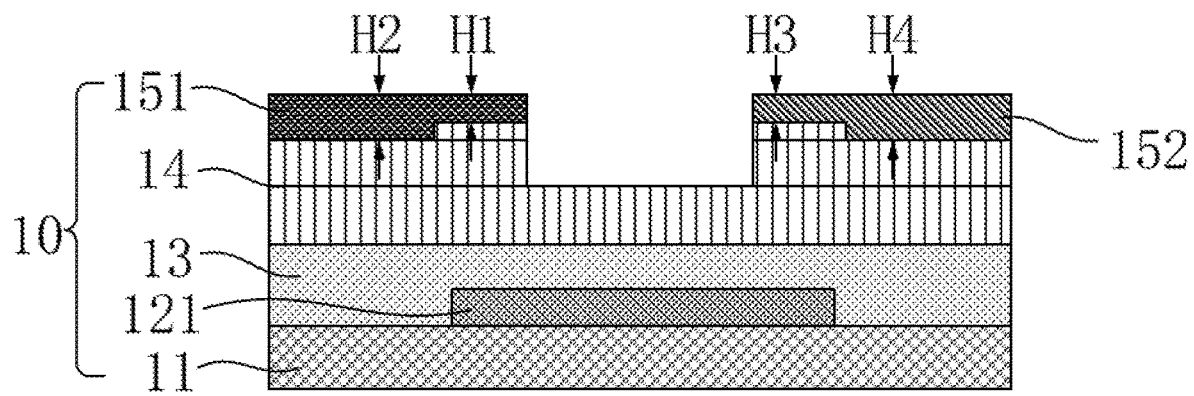
FIG. 4 is a schematic sectional view of another array substrate according to this application.
Figure 5:
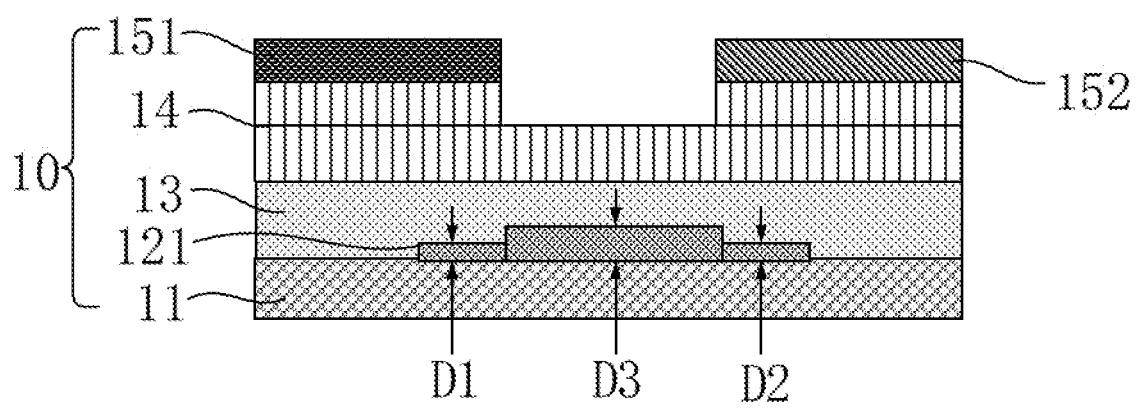
FIG. 5 is a schematic sectional view of another array substrate according to this application.

As shown in FIG. 1, the inventor learns of an array substrate structure.

This application is further described below with reference to the accompanying drawings and preferred embodiments.

As shown in FIG. 2 to FIG. 5, in an embodiment, an array substrate 10 is disclosed. The array substrate 10 includes a substrate 11, a first metal layer 12 arranged on a surface of the substrate 11, an insulating layer 13 arranged on a surface of the first metal layer 12, a semiconductor layer 14 arranged on a surface of the insulating layer 13, and a second metal layer 15 arranged on a surface of the semiconductor layer 14. An overlapping region exists between the first metal layer 12 and the second metal layer 15. An area of a region overlapping the second metal layer 15 on the first metal layer 12 is less than that of a region not overlapping the second metal layer 15 on the first metal layer 12.

The array substrate 10 mainly uses a bottom gate TFT (Bottom Gate TFT). For the array substrate 10 of such a structure, the area of the region overlapping the second metal layer 15 on the first metal layer 12 is relatively large, and parasitic capacitance of TFTs is relatively large, which is not good for high resolution and an aperture ratio of a display panel, and affects display quality of the display panel. In this application, the first metal layer 12 is below the second metal layer 15. The area of the region overlapping the second metal layer 15 on the first metal layer 12 is less than that of the region not overlapping the second metal layer 15 on the first metal layer 12. The area of the overlapping region decreases, and parasitic capacitance generated between the first metal layer 12 and the second metal layer 15 decreases, which is good for the high resolution and the aperture ratio of the display panel, and improves the display quality of the display panel.

In an embodiment, the first metal layer 12 includes a gate 121, arranged on the surface of the substrate 11, the second metal layer 15 includes a source 151 and a drain 152, the source 151 is arranged on one side of the semiconductor layer 14, and the drain 152 is arranged on the other side of the semiconductor layer 14.

An overlapping region exists between the gate 121 and the source 151, and an overlapping region exists between the gate 121 and the drain 152.

An area of a region overlapping the gate 121 on the source 151 is less than that of a region not overlapping the gate 121 on the source 151, and an area of a region overlapping the gate 121 on the drain 152 is less than that of a region not overlapping the gate 121 on the drain 152.

In this solution, the area of the region overlapping the gate 121 on the source 151 and the area of the region overlapping the gate 121 on the drain 152 are relatively large, and the parasitic capacitance of the TFTs is relatively large, which is not good for the high resolution and the aperture ratio of the display panel, and affects the display quality of the display panel. The gate 121 is below the source 151 and the drain 152. The area of the region overlapping the gate 121 on the source 151 is less than that of the region not overlapping the gate 121 on the source 151. The area of the region overlapping the gate 121 on the drain 152 is less than that of the region not overlapping the gate 121 on the drain 152. The areas of the overlapping regions decrease, and parasitic capacitance generated between the gate 121 and the source 151 and between the gate 121 and the drain 152 decreases, which is good for the high resolution and the aperture ratio of the display panel, and improves the display quality of the display panel.

In an embodiment, a length of the region overlapping the gate 121 on the source 151 is L1, a length of the region not overlapping the gate 121 on the source 151 is L2, a length of the region overlapping the gate 121 on the drain 152 is L3, a length of the region not overlapping the gate 121 on the drain 152 is L4, L1 is less than L2, and L3 is less than L4.

The length of the region overlapping the gate 121 on the source 151 is less than that of the region not overlapping the gate 121 on the source 151, and the length of the region overlapping the gate 121 on the drain 152 is less than that of the region not overlapping the gate 121 on the drain 152. The area of a region overlapping the source 151 on the gate 121 and the area of a region overlapping the drain 152 on the gate 121 decrease, and the parasitic capacitance generated between the gate 121 and the source 151 and between the gate 121 and the drain 152 decreases, which is good for the high resolution and the aperture ratio of the display panel, and improves the display quality of the display panel.

In an embodiment, L1 and L3 range from 0.5 µm to 3 µm.

L1 and L3 range from 0.5 µm to 3 µm. For example, when L1 and L3 are 0.5 µm, 1 µm, 2 µm, or 3 µm, alignment precision of yellow light can be ensured. The length of the region overlapping the source 151 on the gate 121 and the length of the region overlapping the drain 152 on the gate 121 are not excessively large, the parasitic capacitance is small, the lengths of the overlapping regions are not excessively small and are sufficient, the semiconductor layer 14 between the region overlapping the source 151 on the gate 121 and the region overlapping the drain 152 on the gate 121 is sufficient, and conduction effects of the source 151 and the drain 152 are good.

In an embodiment, L1 is one quarter to two thirds L2, and L3 is one quarter to two thirds L4.

In this solution, L1 is one quarter to two thirds L2, and L3 is one quarter to two thirds L4. For example, when L1 is one quarter, one third, one half, or two thirds L2, and L3 is one quarter, one third, one half, or two thirds L4, the length of the region overlapping the source 151 on the gate 121 and the length of the region overlapping the drain 152 on the gate 121 are not excessively large, the parasitic capacitance is small, the lengths of the overlapping regions are not excessively small and are sufficient, the semiconductor layer 14 between the region overlapping the source 151 on the gate 121 and the region overlapping the drain 152 on the gate 121 is sufficient, and the conduction effects of the source 151 and the drain 152 are good.

In an embodiment, a width of the region overlapping the source 151 on the gate 121 is W1, a width of the source 151 is W2, and a width of the region overlapping the drain 152 on the gate 121 is W3, a width of the drain 152 is W4, W1 is less than W2, and W3 is less than W4.

In this solution, the width of the region overlapping the source 151 on the gate 121 is less than that of a region not overlapping the source 151 on the gate 121. The width of the region overlapping the drain 152 on the gate 121 is less than that of a region not overlapping the drain 152 on the gate 121. The area of the region overlapping the source 151 on the gate 121 and the area of the region overlapping the drain 152 on the gate 121 decrease, and the parasitic capacitance generated between the gate 121 and the source 151 and between the gate 121 and the drain 152 decreases, which is good for the high resolution and the aperture ratio of the display panel, and improves the display quality of the display panel.

In an embodiment, a thickness of the region overlapping the source 151 on the gate 121 is D1, a thickness of the region overlapping the drain 152 on the gate 121 is D2, a thickness of a region not overlapping the source 151 on the gate 121 and the drain 152 is D3, and D1 and D2 is less than D3.

The thickness of the region overlapping the source 151 on the gate 121 and the thickness of the region overlapping the drain 152 on the gate 121 are less than the thickness of a region not overlapping the source 151 on the gate 121 and the drain 152. A distance between the overlapping region between the gate 121 and the source 151 and the overlapping region between the gate 121 and the drain 152 increases, and parasitic capacitance can further decrease, which is good for the high resolution and the aperture ratio of the display panel, and improves the display quality of the display panel.

In an embodiment, a thickness of the region overlapping the gate 121 on the source 151 is H1, a thickness of the region not overlapping the gate 121 on the source 151 is H2, and a thickness of the region overlapping the gate 121 on the drain 152 is H3, a thickness of the region not overlapping the gate 121 on the drain 152 is H4, H2 is greater than H1, and H4 is greater than H3.

The thickness of the region overlapping the gate 121 on the source 151 is less than that of the region not overlapping the gate 121 on the source 151, and the thickness of the region overlapping the gate 121 on the drain 152 is less than that of the region not overlapping the gate 121 on the drain 152. The distance between the overlapping region between the gate 121 and the source 151 and the overlapping region between the gate 121 and the drain 152 increases, and the parasitic capacitance can further decrease, which is good for the high resolution and the aperture ratio of the display panel, and improves the display quality of the display panel.

In an embodiment, D1 is one third to two thirds D3, and D2 is one third to two thirds D3.

When D1 is one third to two thirds D3, for example, D1 is one third, one half, or two thirds D3, and D2 is one third to two thirds D3, for example, D2 is one third, one half, or two thirds D3, the thickness of the region overlapping the source 151 on the gate 121 and the thickness of the region overlapping the drain 152 on the gate 121 are suitable. The distance between the overlapping regions can increase, and the parasitic capacitance can further decrease, which is good for the high resolution and the aperture ratio of the display panel, and improves the display quality of the display panel. In addition, it can be ensured that the overlapping regions are not likely to be broken or damaged due to excessive thinness and the semiconductor layer 14 is normally conducted.

In an embodiment, H1 is one third to two thirds H2, and H3 is one third to two thirds H4.

In this solution, when H1 is one third to two thirds H2, for example, H1 is one third, one half, or two thirds H2, and H3 is one third to two thirds H4, for example, H3 is one third, one half, or two thirds H4, the thickness of the region overlapping the gate 121 on the source 151 and the thickness of the region overlapping the gate 121 on the drain 152 are suitable. The distance between the overlapping regions can increase, and the parasitic capacitance can further decrease, which is good for the high resolution and the aperture ratio of the display panel, and improves the display quality of the display panel. In addition, it can be ensured that the overlapping regions are not likely to be broken or damaged due to excessive thinness and the semiconductor layer 14 is normally conducted.

In another embodiment of this application, refer to FIG. 1 to FIG. 5, a display panel is disclosed. The display panel includes an array substrate 10. The array substrate 10 includes a substrate 11, a first metal layer 12 arranged on a surface of the substrate 11, an insulating layer 13 arranged on a surface of the first metal layer 12, a semiconductor layer 14 arranged on a surface of the insulating layer 13, and a second metal layer 15 arranged on a surface of the semiconductor layer 14. An overlapping region exists between the first metal layer 12 and the second metal layer 15. An area of a region overlapping the second metal layer 15 on the first metal layer 12 is less than that of a region not overlapping the second metal layer 15 on the first metal layer 12.

The array substrate 10 of the display plane mainly uses a bottom gate TFT (Bottom Gate TFT). For the array substrate 10 of such a structure, the area of the region overlapping the second metal layer 15 on the first metal layer 12 is relatively large, and parasitic capacitance of TFTs is relatively large, which is not good for high resolution and an aperture ratio of the display panel, and affects display quality of the display panel. In this application, the first metal layer 12 is below the second metal layer 15. The area of the region overlapping the second metal layer 15 on the first metal layer 12 is less than that of the region not overlapping the second metal layer 15 on the first metal layer 12. The area of the overlapping region decreases, and parasitic capacitance generated between the first metal layer 12 and the second metal layer 15 decreases, which is good for the high resolution and the aperture ratio of the display panel, and improves the display quality of the display panel.

In still another embodiment of this application, a method for manufacturing an array substrate 10 is disclosed, including steps of forming a first metal layer 12, an insulating layer 13, a semiconductor layer 14, a second metal layer 15, a passivation layer, and an ITO layer on a substrate 11.

In the steps of forming the first metal layer 12 and forming the second metal layer 15, an area of a region overlapping the second metal layer 15 on the first metal layer 12 is caused to be less than that of a region not overlapping the second metal layer 15 on the first metal layer 12.

By using the method, the area of the region overlapping the second metal layer 15 on the first metal layer 12 is less than that of the region not overlapping the second metal layer 15 on the first metal layer 12. The area of the overlapping region decreases, and parasitic capacitance generated between the first metal layer and the second metal layer decreases, which is good for high resolution and an aperture ratio of a display panel, and improves display quality of the display panel.

The display panel of this application may be a twisted nematic (TN) panel, an in-plane switching (IPS) panel, or a multi-domain vertical alignment (VA) panel, or may certainly be any other suitable type of panel.

The foregoing contents are detailed descriptions of this application in conjunction with specific preferred embodiments, and it should not be considered that the specific implementation of this application is limited to these descriptions. Persons of ordinary skill in the art can further make simple deductions or replacements without departing from the concept of this application, and such deductions or replacements should all be considered as falling within the protection scope of this application.

What is claimed is:

1. An array substrate, comprising:
a substrate;
a first metal layer, arranged on a surface of the substrate;
an insulating layer, arranged on a surface of the first metal layer;
a semiconductor layer, arranged on a surface of the insulating layer; and
a second metal layer, arranged on a surface of the semiconductor layer, wherein
an overlapping region exists between the first metal layer and the second metal layer; and
an area of a region overlapping the second metal layer on the first metal layer is less than that of a region not overlapping the second metal layer on the first metal layer;
wherein the first metal layer comprises a gate, arranged on the surface of the substrate, the second metal layer comprises a source and a drain, the source is arranged on one side of the semiconductor layer, and the drain is arranged on the other side of the semiconductor layer;
an overlapping region exists between the gate and the source, and another overlapping region exists between the gate and the drain; and
an area of a region on the source overlapping the gate is less than that of a region on the source not overlapping the gate, and an area of a region on the drain overlapping the gate is less than that of a region on the drain not overlapping the gate;
wherein a thickness of a portion of the source corresponding to the respective overlapping region is less than that of a remaining portion of the source not overlapping the gate, and a thickness of a portion of the drain corresponding to the respective overlapping region is less than that of a remaining portion of the drain not overlapping the gate;
wherein a width of the portion of the gate overlapping the source measured along a direction perpendicular to a direction pointing from the source to the drain is less than a width of the source measured along a direction perpendicular to a direction pointing from the source to the drain, and a width of the portion of the gate overlapping the drain measured along a direction perpendicular to a direction pointing from the source to the drain is less than a width of the drain measured along a direction perpendicular to a direction pointing from the source to the drain;
wherein a length of the portion of the source corresponding to the respective overlapping region measured along the direction pointing from the source to the drain is less than a length of the portion of the source not overlapping the gate measured along the direction pointing from the source to the drain, and a length of the portion of the drain corresponding to the respective overlapping region measured along the direction pointing from the source to the drain is less than a length of the portion of the drain not overlapping the gate measured along the direction pointing from the source to the drain.

2. The array substrate according to claim 1, wherein the length of the portion of the source corresponding to the respective overlapping region ranges from 0.5 µm to 3 µm, and the length of the portion of the drain corresponding to the respective overlapping region ranges from 0.5 µm to 3 µm.

3. The array substrate according to claim 1, wherein the length of the portion of the source corresponding to the respective overlapping region is one quarter to two thirds the length of the portion of the source not overlapping the gate, and the length of the portion of the drain corresponding to the respective overlapping region is one quarter to two thirds the length of the portion of the drain not overlapping gate.

4. The array substrate according to claim 1, wherein a thickness of the portion of the gate overlapping the source is one third to two thirds that of a portion of the gate not overlapping the source and the drain, and a thickness of a portion of the gate overlapping the drain is one third to two thirds that of the portion of the gate not overlapping the source and the drain.

5. The array substrate according to claim 1, wherein the thickness of the portion of the source overlapping the gate is one third to two thirds the thickness of the portion of the source not overlapping the gate, and the thickness of the portion of the drain overlapping the gate is one third to two thirds the thickness of the portion of the drain not overlapping the gate.

6. A display panel, comprising an array substrate, wherein the array substrate comprises:
a substrate;
a first metal layer, arranged on a surface of the substrate;
an insulating layer, arranged on a surface of the first metal layer;
a semiconductor layer, arranged on a surface of the insulating layer; and
a second metal layer, arranged on a surface of the semiconductor layer, wherein
an overlapping region exists between the first metal layer and the second metal layer; and
an area of a region overlapping the second metal layer on the first metal layer is less than that of a region not overlapping the second metal layer on the first metal layer;
wherein the first metal layer comprises a gate, arranged on the surface of the substrate, the second metal layer comprises a source and a drain, the source is arranged on one side of the semiconductor layer, and the drain is arranged on the other side of the semiconductor layer;
an overlapping region exists between the gate and the source, and another overlapping region exists between the gate and the drain; and
an area of a region on the source overlapping the gate is less than that of a region on the source not overlapping the gate, and an area of a region on the drain overlapping the gate is less than that of a region on the drain not overlapping the gate;
wherein a thickness of a portion of the source corresponding to the respective overlapping region is less than that of a remaining portion of the source not overlapping the gate, and a thickness of a portion of the drain corresponding to the respective overlapping region is less than that of a remaining portion of the drain not overlapping the gate;
wherein a width of the portion of the gate overlapping the source measured along a direction perpendicular to a direction pointing from the source to the drain is less than a width of the source measured along a direction perpendicular to a direction pointing from the source to the drain, and a width of the portion of the gate overlapping the drain measured along a direction perpendicular to a direction pointing from the source to the drain is less than a width of the drain measured along a direction perpendicular to a direction pointing from the source to the drain;
wherein a length of the portion of the source corresponding to the respective overlapping region measured along the direction pointing from the source to the drain is less than a length of the portion of the source not overlapping the gate measured along the direction pointing from the source to the drain, and a length of the portion of the drain corresponding to the respective overlapping region measured along the direction pointing from the source to the drain is less than a length of the portion of the drain not overlapping the gate measured along the direction pointing from the source to the drain.

7. The display panel according to claim 6, wherein a length of the portion of the source corresponding to the respective overlapping region is less than a length of the portion of the source not overlapping the gate, and a length of the portion of the drain corresponding the respective overlapping region is less than a length of the portion of the drain overlapping the gate.

8. The display panel according to claim 7, wherein the length of the portion of the source corresponding to the respective overlapping region ranges from 0.5 µm to 3 µm, and the length of the portion of the drain corresponding to the respective overlapping region ranges from 0.5 µm to 3 µm.

9. The display panel according to claim 7, wherein the length of the portion of the source corresponding to the respective overlapping region is one quarter to two thirds the length of the portion of the source not overlapping the gate, and the length of the portion of the drain corresponding to the respective overlapping region is one quarter to two thirds the length of the portion of the drain not overlapping the gate.

10. The display panel according to claim 7, wherein a thickness of the portion of the gate overlapping the source is one third to two thirds that of a portion of the gate not overlapping the source and the drain, and a thickness of a portion of the gate overlapping the drain is one third to two thirds that of the portion of the gate not overlapping the source and the drain.

11. The array substrate according to claim 6, wherein the thickness of the portion of the source overlapping the gate is one third to two thirds the thickness of the portion of the source not overlapping the gate, and the thickness of the portion of the drain overlapping the gate is one third to two thirds the thickness of the portion of the drain not overlapping the gate.

12. The array substrate according to claim 1, wherein the source has a flat top surface facing away from the gate, wherein the portion of the source overlapping the gate has a bottom surface that is higher than a bottom surface of the portion of the source not overlapping the gate.

13. The display panel according to claim 6, wherein the source has a flat top surface facing away from the gate, wherein the portion of the source overlapping the gate has a bottom surface that is higher than a bottom surface of the portion of the source not overlapping the gate.

* * * * *